(12) United States Patent
Liu et al.

(10) Patent No.: US 10,084,147 B2
(45) Date of Patent: Sep. 25, 2018

(54) DISPLAY DEVICE

(71) Applicant: InnoLux Corporation, Miao-Li County (TW)

(72) Inventors: Tung-Kai Liu, Miao-Li County (TW); Tsau-Hua Hsieh, Miao-Li County (TW); Chun-Hsien Lin, Miao-Li County (TW); Shu-Ming Kuo, Miao-Li County (TW); Chih-Yung Hsieh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/634,025

(22) Filed: Jun. 27, 2017

(65) Prior Publication Data

US 2017/0373264 A1 Dec. 28, 2017

Related U.S. Application Data

(60) Provisional application No. 62/371,246, filed on Aug. 5, 2016, provisional application No. 62/355,392, filed on Jun. 28, 2016.

(30) Foreign Application Priority Data

Feb. 13, 2017 (CN) .......................... 2017 1 0076375

(51) Int. Cl.
*G01D 11/28* (2006.01)
*H01L 51/50* (2006.01)
*G02F 1/13357* (2006.01)
*H01L 51/52* (2006.01)
*G02F 1/1335* (2006.01)

(52) U.S. Cl.
CPC ........ *H01L 51/5012* (2013.01); *G02F 1/1336* (2013.01); *H01L 51/5088* (2013.01); *G02F 2001/133519* (2013.01); *H01L 51/5032* (2013.01); *H01L 51/5275* (2013.01)

(58) Field of Classification Search
CPC ....... G02F 1/1336; G02F 2001/133519; H01L 51/5012; H01L 51/5032; H01L 51/5088; H01L 51/5275
See application file for complete search history.

(56) References Cited

U.S. PATENT DOCUMENTS

| | | | |
|---|---|---|---|
| 2016/0357286 A1* | 12/2016 | Tsai | G06F 3/044 |
| 2017/0263828 A1* | 9/2017 | Mao | H01L 33/58 |
| 2017/0338212 A1* | 11/2017 | Kuo | H01L 25/167 |
| 2017/0372677 A1* | 12/2017 | Chang | G09G 3/3233 |

* cited by examiner

*Primary Examiner* — Ali Alavi
(74) *Attorney, Agent, or Firm* — McClure, Qualey & Rodack, LLP

(57) ABSTRACT

A display device is provided. The display device includes a first substrate having a light-emitting region and a first transparent region. The first substrate includes a plurality of transistors and at least one light-emitting diode disposed in the light-emitting region. The light-emitting diode includes a first electrode electrically connected to the corresponding transistor and a first semiconductor layer disposed over the first electrode. The light-emitting diode also includes a second semiconductor layer disposed over the first semiconductor layer and a light-emitting layer disposed between the first semiconductor layer and the second semiconductor layer, wherein the distance between the top surface of the first electrode and the top surface of the second semiconductor layer is between 2 μm and 12 μm.

20 Claims, 17 Drawing Sheets ial application of U.S. patent application No. 62/355,392 filed on Jun. 28, 2016 and provisional application of U.S. patent application No. 62/371,246 filed on Aug. 5, 2016, the entireties of which are incorporated by reference herein.

DISPLAY DEVICE

CROSS REFERENCE TO RELATED APPLICATIONS

This application claims priority of China Patent Application No. 201710076375.X filed on Feb. 13, 2017. This application also claims the benefit of priority from provision

BACKGROUND OF THE INVENTION

Field of the Invention

The embodiments of the disclosure relate to a display device, and in particular to a display device with a light-emitting element.

Description of the Related Art

As digital technology develops, display devices are becoming more widely used in society. For example, display devices have been applied to modern information and communication devices such as televisions, notebooks, computers, mobile phones and smartphones. In addition, each generation of display devices has been developed to be thinner, lighter, smaller, and more fashionable. The display devices include light-emitting diode display devices.

The recombination radiation of electron and hole in the light-emitting diode may produce electromagnetic radiation (such as light) through the current at the p-n junction. For example, in the forward bias p-n junction formed by direct band gap materials such as GaAs or GaN, the recombination of electron and hole injected into the depletion region results in electromagnetic radiation such as light. The aforementioned electromagnetic radiation may lie in the visible region or the non-visible region. Materials with different band gaps may be used to form light-emitting diodes of different colors.

Since mass production has become the tendency recently in the light-emitting diode industry, any increase in the yield of manufacturing light-emitting diodes will reduce costs and result in huge economic benefits. However, existing display devices have not been satisfactory in every respect.

Therefore, a cost-effective display device is needed.

BRIEF SUMMARY OF THE INVENTION

The present disclosure provides a display device, including a first substrate having a light-emitting region and a first transparent region. The first substrate includes a plurality of transistors and at least one light-emitting diode disposed in the light-emitting region. The light-emitting diode includes a first electrode electrically connected to the corresponding transistor and a first semiconductor layer disposed over the first electrode. The light-emitting diode also includes a second semiconductor layer disposed over the first semiconductor layer and a light-emitting layer disposed between the first semiconductor layer and the second semiconductor layer, wherein the distance between a top surface of the first electrode and a top surface of the second semiconductor layer is between 2 μm and 12 μm.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION OF THE INVENTION

Figure 1:
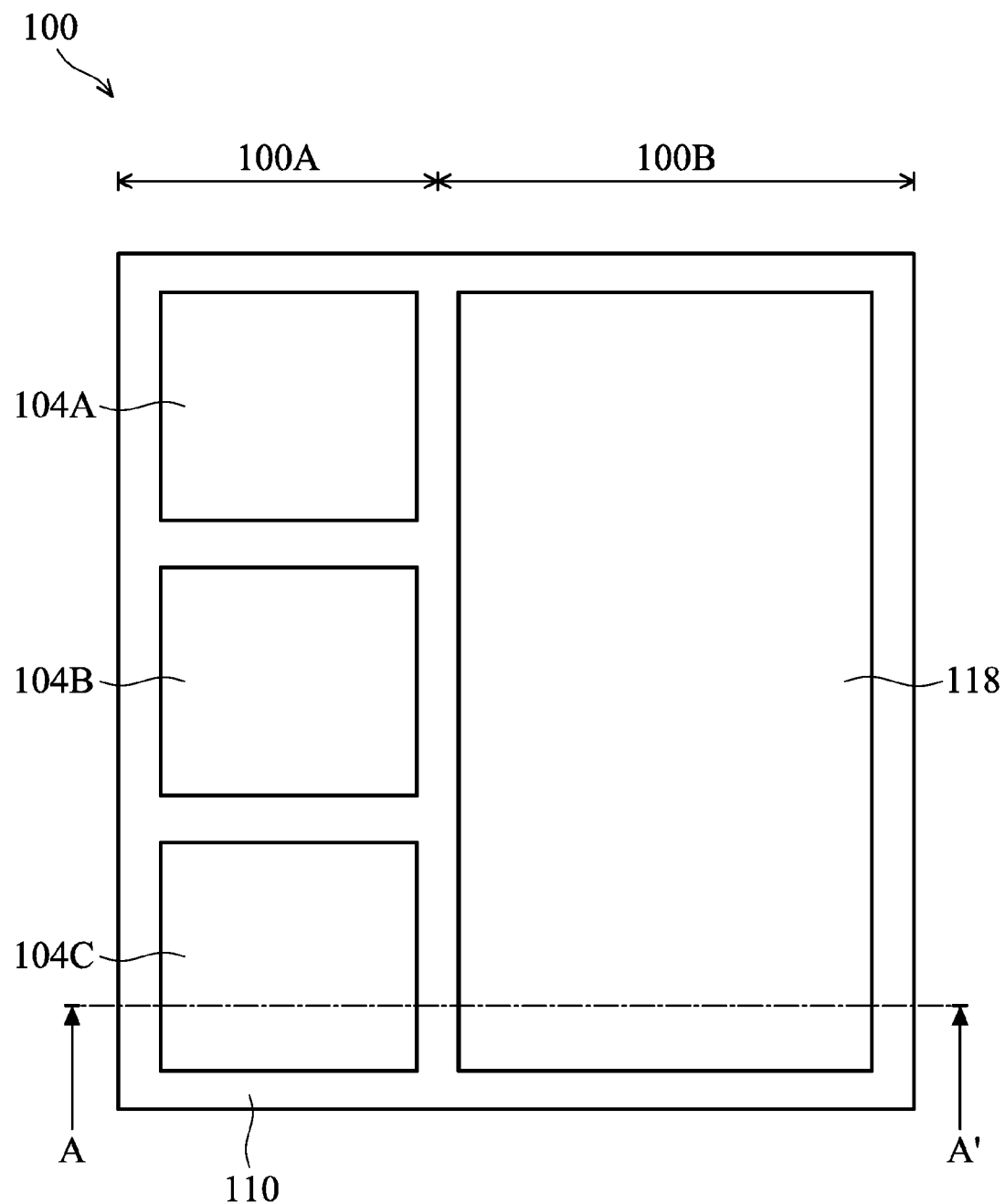
FIG. 1 is a top view of a display device in accordance with some embodiments of the present disclosure.

The display device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term "substrate" is meant to include devices formed within a transparent substrate and the layers overlying the transparent substrate. All transistor element needed may be already formed over the substrate. However, the substrate is represented with a flat surface in order to simplify the drawing. The term "substrate surface" is meant to include the uppermost exposed layers on a transparent substrate, such as an insulating layer and/or metallurgy lines.

Figure 2:
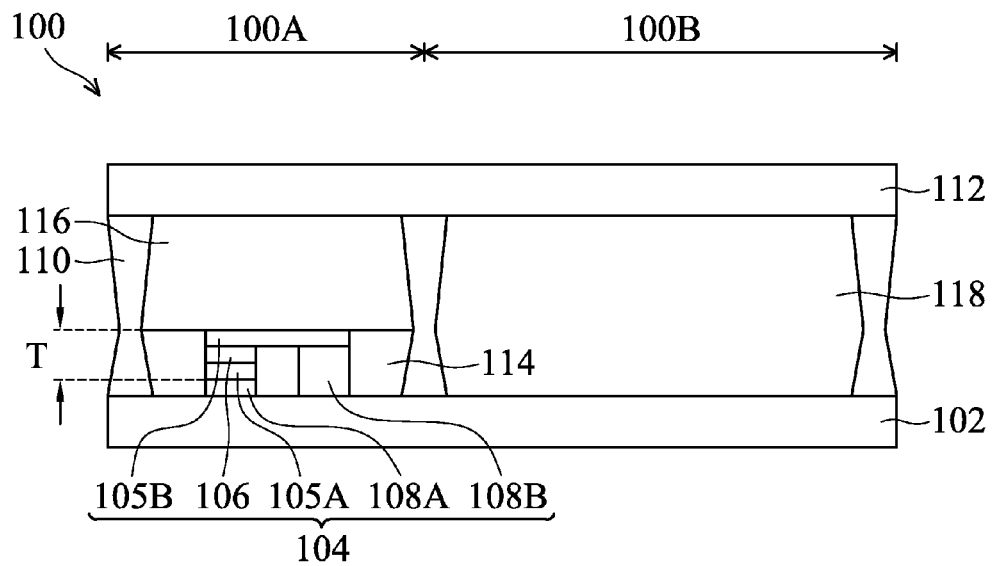
FIG. 2 is a cross-sectional view along line A-A' of the display device in FIG. 1 in accordance with some embodiments of the present disclosure.

At first, referring to FIGS. 1-2, FIG. 1 is a top view of a display device 100 in accordance with some embodiments of the present disclosure. FIG. 2 is a cross-sectional view along line A-A' of the display device 100 in FIG. 1 in accordance with some embodiments of the present disclosure.

As shown in FIGS. 1 and 2, the display device 100 includes a first substrate 102, the first substrate 102 includes a light-emitting region 100A and a transparent region 100B. The light-emitting region 100A is separated from the transparent region 100B by a light shielding layer 110. The light shielding layer 110 is used to shield the elements or region which is not used to display colors in the display device 100. For example, the light shielding layer 110 may be used to shield the data lines and scan lines. The light shielding layer 110 may include, but is not limited to, black photoresist, black printing ink, black resin or any other suitable light-shielding materials or light-shielding colors. Generally, the light-shielding materials and the light-shielding colors may prevent light from being transmitted, and are not limited to the absorption of light. The light-shielding materials and the light-shielding colors may also be highly reflective. The light-shielding colors may include, but are not limited to, high-concentration white material. The light-shielding colors are not limited to consisting of one material. The light-shielding colors may also include a transparent material covered by highly reflective metal material.

As shown in FIG. 1, the light-emitting region 100A includes a first light-emitting region 104A, a second light-emitting region 104B and a third light-emitting region 104C. In some embodiments, the first light-emitting region 104A corresponds to a blue pixel, the second light-emitting region 104B corresponds to a green pixel, and the third light-emitting region 104C corresponds to a red pixel. The first light-emitting region 104A, the second light-emitting region 104B and the third light-emitting region 104C each have one light-emitting diode.

As shown in FIG. 2, the display device 100 includes the first substrate 102, a light-emitting diode 104 and a protective substrate 112. As shown in FIG. 1, the light-emitting diode 104 is formed between the first substrate 102 and the protective substrate 112, and in the light-emitting region 100A of the display device 100.

The first substrate 102 includes an integrated circuit (not shown) electrically connected to the light-emitting diode 104. The integrated circuit (IC) may include, but is not limited to, a micro-processor, a memory element and/or other elements. The IC may also include various passive and active microelectronic devices, such as thin film resistors, other capacitors (e.g., metal-insulator-metal capacitor, MIMCAP), inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, or other types of transistors. The protective substrate 112 may include, but is not limited to, a glass substrate, a ceramic substrate, a plastic substrate or another applicable substrate.

The light-emitting diode 104 includes a first electrode 108A, a first semiconductor layer 105A formed over the first electrode 108A, and a light-emitting layer 106 formed over the first semiconductor layer 105A. The light-emitting diode 104 also includes a second semiconductor layer 105B formed over the light-emitting layer 106 and a second electrode 108B adjacent to the second semiconductor layer 105B. The first electrode 108A and the second electrode 108B are electrically connected to integrated circuits of the first substrate 102. The first electrode 108A and the second electrode 108B may include, but are not limited to, copper, aluminum, molybdenum, tungsten, gold, chromium, nickel, platinum, titanium, iridium, rhodium, the above alloys, a combination thereof, or another electrically conductive metal material. The first semiconductor layer 105A and the second semiconductor layer 105B may include, but are not limited to, an element semiconductor which may include amorphous-Si, poly-Si, germanium; a compound semiconductor which may include gallium nitride (GaN), silicon carbide, gallium arsenide, gallium phosphide, indium phosphide, indium arsenide and/or indium antimonide; an alloy semiconductor which may include SiGe alloy, GaAsP alloy, AlInAs alloy, AlGaAs alloy, GaInAs alloy, GaInP alloy, GaInAsP alloy, or a combination thereof. The first semiconductor layer 105A and the second semiconductor layer 105B may also include, but are not limited to, metal oxide such as indium gallium zinc oxide (IGZO), indium zinc oxide (IZO), indium gallium zinc oxide (IGZTO), or organic semiconductor including polycyclic aromatic compound, or a combination thereof.

The light-emitting layer 106 may include, but is not limited to, homojunction, heterojunction, single-quantum well (SQW), multiple-quantum well (MQW) or any other applicable structure. In some embodiments, the light-emitting layer 106 includes un-doped n type $In_xGa_{(1-x)}N$. In other embodiments, the light-emitting layer 106 includes such materials as $Al_xIn_yGa_{(1-x-y)}N$ and other materials. Moreover, the light-emitting layer 106 may include a multiple-quantum well structure with multiple-quantum layers (such as InGaN) and barrier layers (such as GaN) arranged alternately. Moreover, the light-emitting layer 106 may be formed by metal organic chemical vapor deposition (MOCVD), molecular beam epitaxy (MBE), hydride vapor phase epitaxy (HVPE), liquid phase epitaxy (LPE) or any other applicable chemical vapor deposition process.

In some embodiments, the light-emitting diode 104 is a micro light-emitting diode (μ-LED). As shown in FIG. 2, the distance T between the top surface of the first electrode 108A and the top surface of the semiconductor layer 105B is in a range of 2 μm to 12 μm. In some embodiments, distance T is between 3 μm and 5 μm.

In some embodiments, the light-emitting diode 104 of the first light-emitting region 104A emits blue light, the light-emitting diode 104 of the second light-emitting region 104B emits green light, and the light-emitting diode 104 of the first light-emitting region 104C emits red light. In some embodiments, the display device 100 includes a first filler 114 and a second filler 116 formed in the light-emitting region 100A, and includes a third filler 118 formed in the transparent region 100B. As shown in FIG. 2, the first filler 114 is formed over the first substrate 102, and the second filler 116 is formed over the first filler 114. The material of the first filler 114, the second filler 116 and the third filler 118 may include, but is not limited to, silicone, epoxy, poly(methyl methacrylate) (PMMA), polycarbonate (PC) and other applicable materials. In some embodiments, the transmittance of the third filler 118 is greater than the transmittance of the first filler 114, and the transmittance of the first filler 114 is different than the transmittance of the second filler 116.

Figure 3:
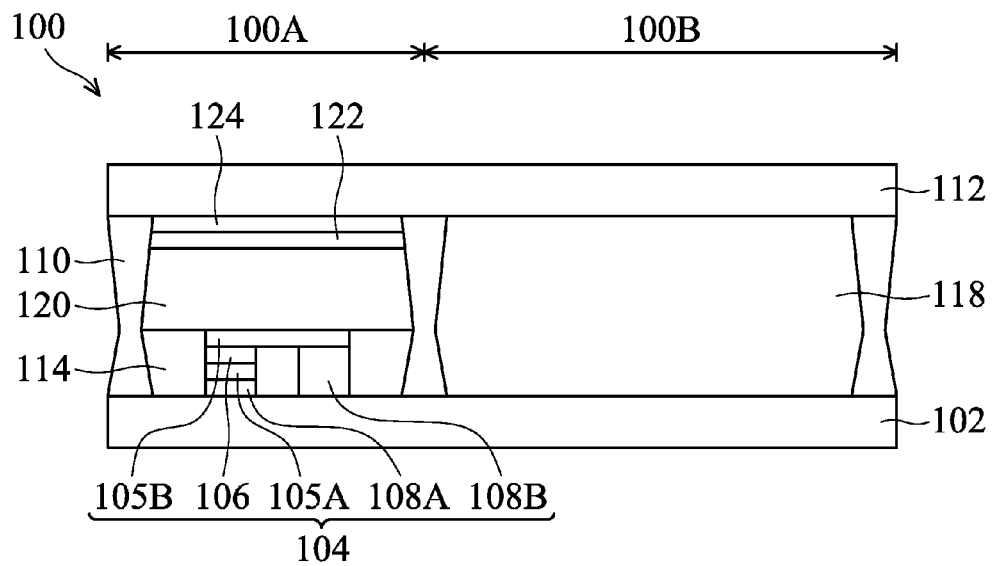
FIG. 3 is a cross-sectional view along line A-A' of the display device in FIG. 1 in accordance with other embodiments of the present disclosure.

Next, FIG. 3 is a cross-sectional view along line A-A' of the display device 100 in FIG. 1 in accordance with other embodiments of the present disclosure. In some embodiments, the light-emitting diode 104 of the first light-emitting region 104A, the second light-emitting region 104B and the third light-emitting region 104C all emit blue light. In this embodiment, the cross-sectional structures of the second light-emitting region 104B and the third light-emitting region 104C may be the structure shown in the light-emitting region 100A of FIG. 3, and the cross-sectional structure of the first light-emitting region 104A may be the structure shown in the light-emitting region 100A of FIG. 2.

As shown in FIG. 3, the display device 100 includes a quantum dot film 120 formed over the first filler 114. The material of the quantum dot film 120 may include, but is not limited to, an organic layer blended with a quantum dot or an inorganic layer blended with a quantum dot. The quantum dot may be a nano three-dimensional structure including zinc, cadmium, selenium, sulfur, or a combination thereof. The grain diameter of the quantum dot may range from about 1 nm-10 nm. By fine-tuning the grain diameter of the quantum dot, the spectrum of light resulting from the excitation of the quantum dot film 120 by the light source (for example, blue light with a wavelength ranging from about 380~500 nm) may be altered. For example, the first quantum dot film blended with a quantum dot having the first grain diameter may emit light of a first color after excitation by blue light. The second quantum dot film blended with a quantum dot having the second grain diameter may emit light of a second color after excitation by blue light. The third quantum dot film blended with a quantum dot having the third grain diameter may emit light of a third color after excitation by blue light. Light of the first color, second color, and third color may each have a different spectrum. In some embodiments, the quantum dot film 120 of the second light-emitting region 104B emits green light after excitation by blue light, and the quantum dot film 120 of the third light-emitting region 104C emits red light after excitation by blue light.

As shown in FIG. 3, the display device 100 further includes a color conversion enhancement layer 122 formed over the quantum dot film 120, and a light filter 124 formed over the color conversion enhancement layer 122. The color conversion enhancement layer 122 may include, but is not limited to, a material reflecting blue light. Unexcited blue light may be reflected back to the quantum dot film 120 by the color conversion enhancement layer 122, and thereby the efficiency of transformation from blue light to light of another color through the quantum dot film 120 is improved. The light filter 124 may include, but is not limited to, a blue light filter, a red light filter or a green light filter. In some embodiments, the first light-emitting region 104A, the second light-emitting region 104B and the third light-emitting region 104C all emit blue light. The cross-sectional structures of the first light-emitting region 104A, the second light-emitting region 104B and the third light-emitting region 104C may be the structure shown in the light-emitting region 100A of FIG. 3. In this embodiment, the quantum dot film 120 of the first light-emitting region 104A, the second light-emitting region 104B and the third light-emitting region 104C emit white light after excitation by blue light, and this white light presents different colors through the light filter 124.

Figure 4:
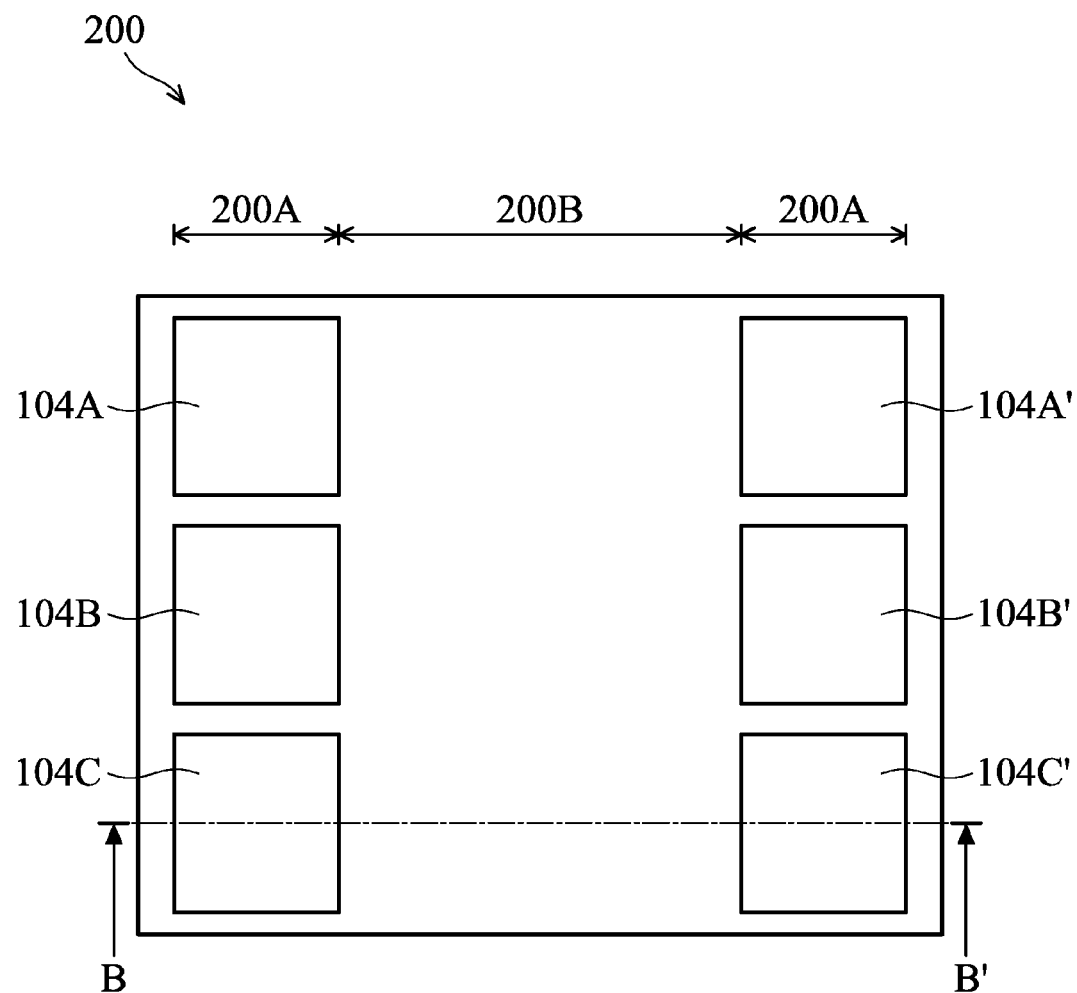
FIG. 4 is a top view of a display device in accordance with some embodiments of the present disclosure.
Figure 5:
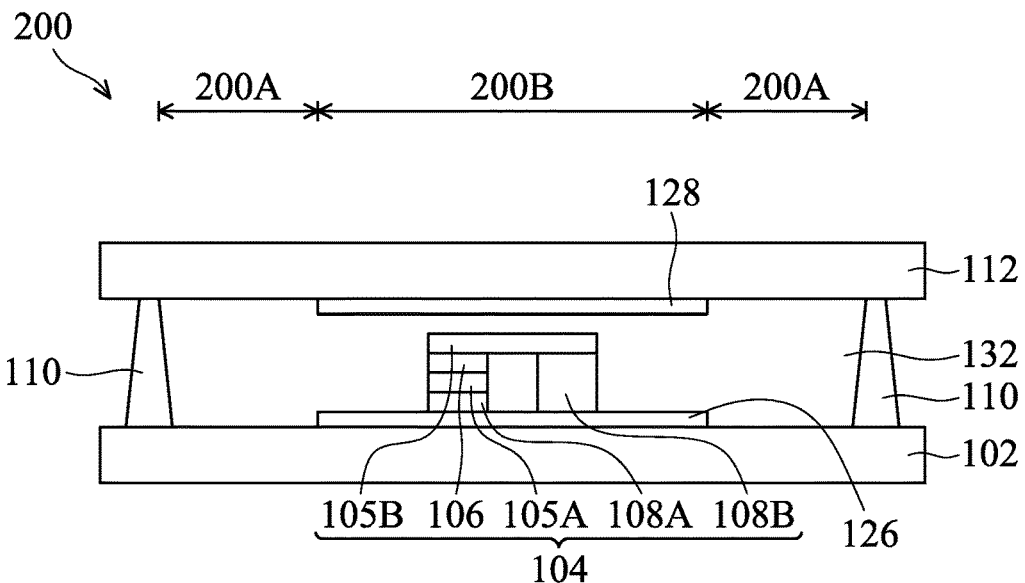
FIG. 5 is a cross-sectional view along line B-B' of the display device in FIG. 4 in accordance with some embodiments of the present disclosure.

FIG. 4 is a top view of a display device 200 in accordance with some embodiments of the present disclosure, and FIG. 5 is a cross-sectional view along line B-B' of the display device 200 in FIG. 4 in accordance with some embodiments of the present disclosure.

As shown in FIG. 4, the display device 200 includes a first substrate 102 having light-emitting regions 200A and a non-light-emitting region 200B. In some embodiments, the light-emitting regions 200A are formed on two opposite sides of the non-light-emitting region 200B. In this embodiment, the light-emitting region 200A includes a first light-emitting region 104A, a first light-emitting region 104A', a second light-emitting region 104B, a second light-emitting region 104B', a third light-emitting region 104C and a third light-emitting region 104C'.

In some embodiments shown in FIG. 5, the light-emitting diode 104 of the first light-emitting region 104A and first light-emitting region 104A' emits blue light, the light-emitting diode 104 of the second light-emitting region 104B and the second light-emitting region 104B' emits green light, and the light-emitting diode 104 of the third light-emitting region 104C and the third light-emitting region 104C' emits red light.

As shown in FIG. 5, the display device 200 includes a first optical layer 126 and a second optical layer 128. The first optical layer 126 is formed between the light-emitting diode 104 and the first substrate 102. The second optical layer 128 is formed over the light-emitting diode 104. In addition, the display device 200 further includes a fourth filler 132 formed between the first optical layer 126 and the second optical layer 128. The first optical layer 126 and the second optical layer 128 may include, but is not limited to, at least two materials which have different refractive indexes, such as chromium oxide, chromium nitride or other applicable materials. In some embodiments, the first optical layer 126 and the second optical layer 128 further have materials with a higher anti-refractive ability near the first substrate 102 and the protective substrate 112, and have materials with a lower anti-refractive ability near the light-emitting diode 104. In addition, the first optical layer 126 and the second optical layer 128 further have materials with a higher refractive index near the first substrate 102 and the protective substrate 112, and have materials with a lower refractive index near the light-emitting diode 104. The first optical layer 126 and the second optical layer 128 may be formed by first coating high-absorptive layers such as metal oxide or metal nitride over the first substrate 102 and the protective substrate 112, and next coating metal on the above high-absorptive layers. The material of the fourth filler 132 may include, but is not limited to, silicone, epoxy, poly(methyl methacrylate), polycarbonate or another applicable composite material such as polymer or an inorganic material with a high refractive index (such as $TiO_2$).

In this embodiment, the light emitted by the light-emitting diode 104 is reflected many times through the first optical layer 126 and the second optical layer 128, and emanates from openings between the second optical layer 128 and a light shielding layer 110. In this embodiment, the light-emitting regions 200A overlap the transparent regions, and the light-emitting regions 200A are formed on two opposite sides of the light-emitting diode 104. For example, the third light-emitting region 104C and the third light-emitting region 104' are formed on two opposite sides of the light-emitting diode 104.

In some embodiments, as shown in FIG. 5, the display device 200 has two light-emitting regions 200A on two opposite sides of the light-emitting diode 104, such as the third light-emitting region 104C and the third light-emitting region 104C'. Moreover, the light coming from these two light-emitting regions 200A is emitted by the same light-emitting diode 104. In some embodiments, one or more light-emitting regions 200A may be formed by patterning the first optical layer 126 and the second optical layer 128.

Figure 6:
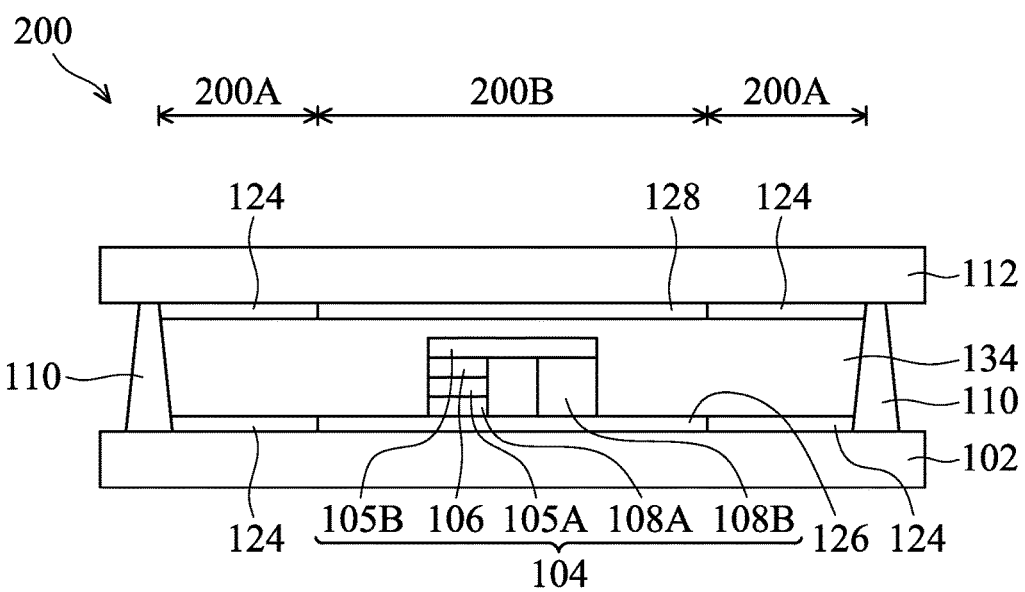
FIG. 6 is a cross-sectional view along line B-B' of the display device in FIG. 4 in accordance with some embodiments of the present disclosure.

FIG. 6 is a cross-sectional view along line B-B' of the display device 200 in FIG. 4 in accordance with some embodiments of the present disclosure. In this embodiment, the light-emitting diode 104 of the first light-emitting region 104A, the first light-emitting region 104A', the second light-emitting region 104B, the second light-emitting region 104B', the third light-emitting region 104C and the third light-emitting region 104C' emit blue light.

As shown in FIG. 6, the display device 200 includes a quantum dot film 134 formed between the first optical layer 126 and the second optical layer 128, and a light filter 124 formed in a position corresponding to the light-emitting region 200A. The material of the quantum dot film 134 may be the same as or similar to that of the quantum dot film 120. In this embodiment, the quantum dot film 134 emits light of various colors after excitation by blue light. For example, the quantum dot film 134 of the second light-emitting region 104B and the second light-emitting region 104B' emits green light after excitation by blue light, and the quantum dot film 134 of the third light-emitting region 104C and the third light-emitting region 104C' emits red light after excitation by blue light. In addition, the above light may be transformed to other colors through the light filter 124.

Figure 7:
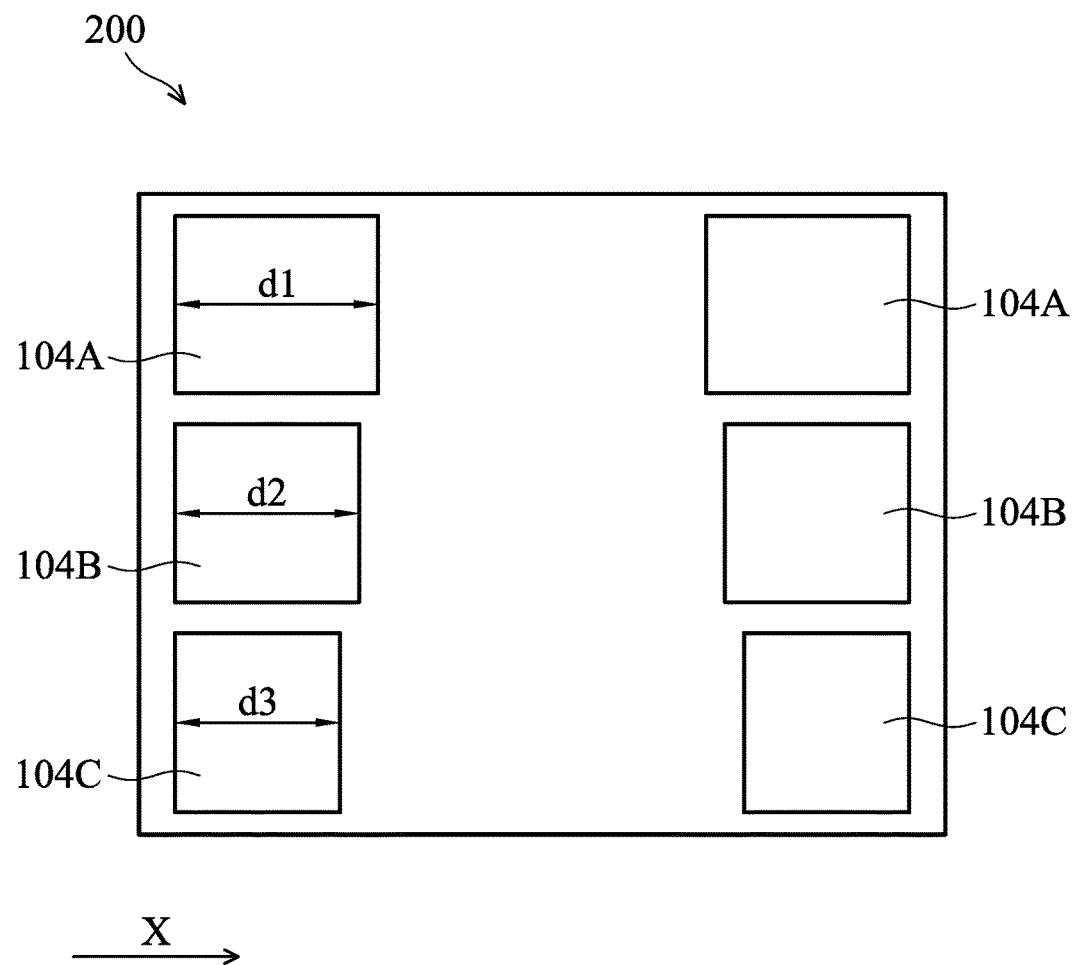
FIG. 7 is a top view of a display device in accordance with some embodiments of the present disclosure.

FIG. 7 is a top view of a display device 200 in accordance with some embodiments of the present disclosure. In some embodiments, as shown in FIG. 7, the first light-emitting region 104A has a first length d1 along a first direction such as X direction, the second light-emitting region 104B has a second length d2 along the first direction, and the third light-emitting region 104C has a third length d3 along the first direction. The first length d1 is greater than the second length d2, and the second length d2 is greater than the third length d3. The length of the first light-emitting region 104A, the second light-emitting region 104B and the third light-emitting region 104C may be modified by patterning the first optical layer 126 and the third optical layer 128. When the length along the first direction of the first optical layer 126 and the third optical layer 128 is greater, the light emitted by the light-emitting diode 104 may be reflected more times and next be emitted by the light-emitting region 200A. As light is reflected more times, the efficiency of transformation from blue light to light of other colors is increased. In addition, as the length of the first optical layer 126 and the second optical layer 128 is greater, the length of the light-emitting region 200A is smaller.

Figure 8:
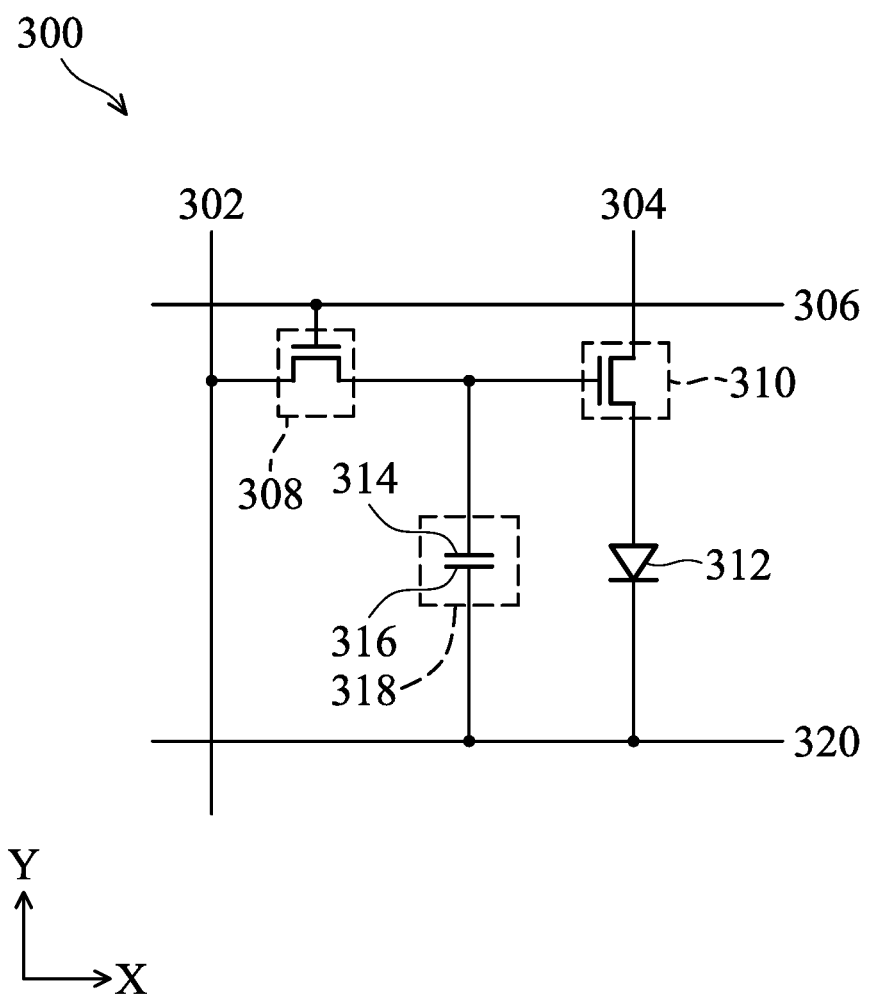
FIG. 8 is a circuit diagram of a display device in accordance with some embodiments of the present disclosure.

FIG. 8 is a circuit diagram of a display device 300 in accordance with some embodiments of the present disclosure. In some embodiments, as shown in FIG. 8, the display device 300 includes a data line 302 and a high voltage circuit 304 extending along a second direction such as Y direction, and includes a scan line 306 and a low voltage circuit 320 extending a first direction perpendicular to the first direction such as X direction. A pixel region is defined by the data line 302, the high voltage circuit 304, the scan line 306 and the low voltage circuit 320.

In addition, in some embodiments, the display device includes a first transistor 308, a second transistor 310, a light-emitting diode 312 and a capacitor 318. As shown in FIG. 8, the scan line 306 is coupled to a gate of the first transistor 308, the data line 302 is coupled to a source of the first transistor 308, and a drain of the first transistor 308 is coupled to a gate of the second transistor 310. In addition, a source of the second transistor 310 is coupled to the high voltage circuit 304, and the drain of the second transistor 310 is coupled to the light-emitting diode 312. Furthermore, a first electrode 314 of the capacitor 318 is coupled to a gate of the second transistor 310, and a second electrode 316 of the capacitor 318 is coupled to the low voltage circuit 320.

Figure 9:
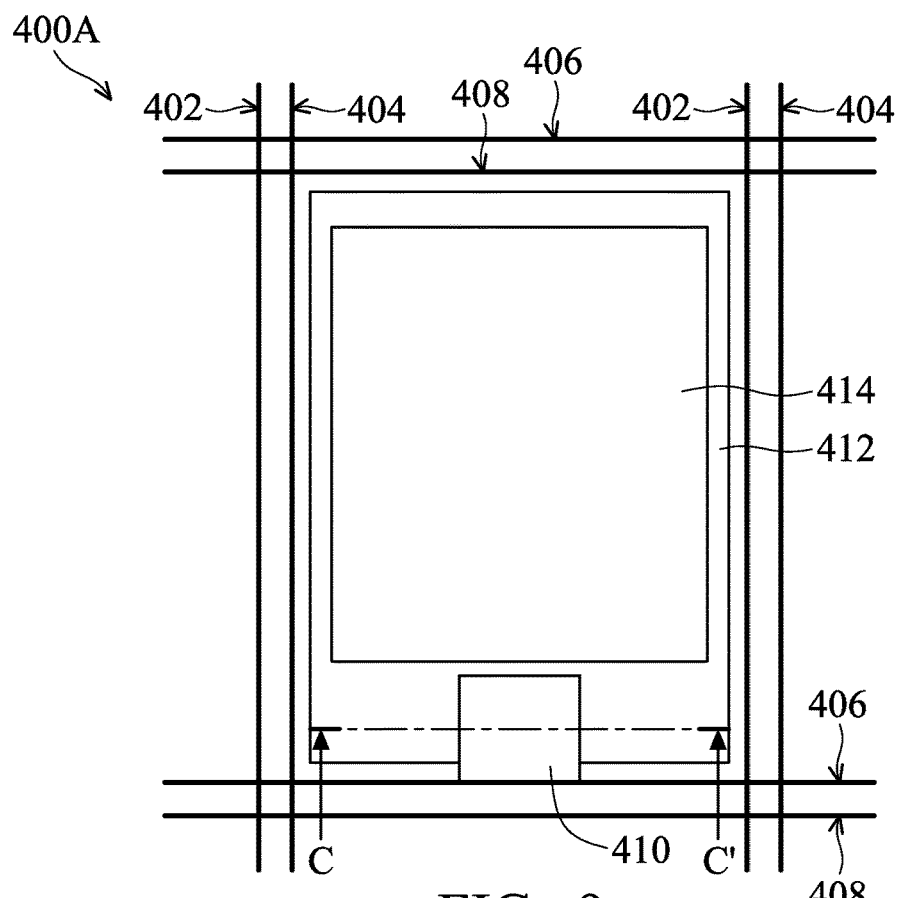
FIG. 9 is a top view of a first substrate in accordance with some embodiments of the present disclosure.
Figure 10:
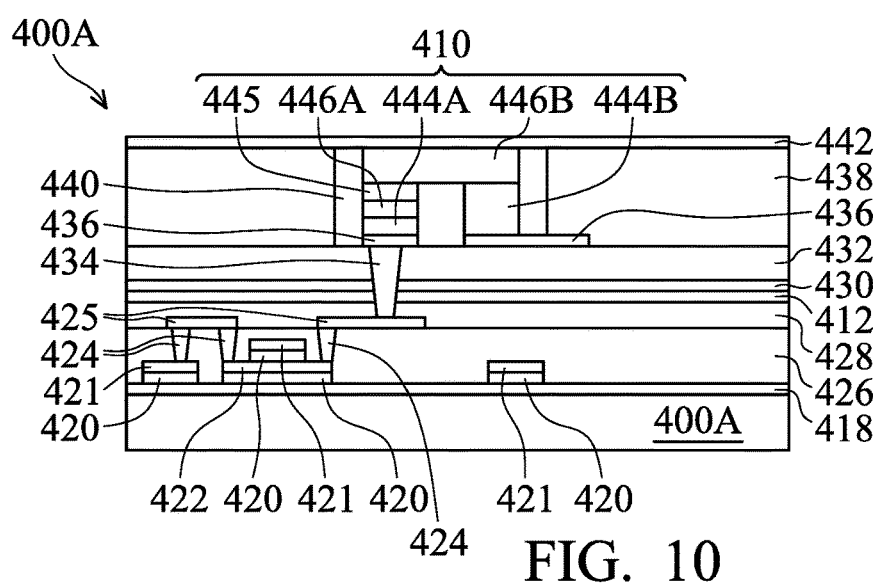
FIG. 10 is a cross-sectional view along line C-C' of the first substrate in FIG. 9 in accordance with some embodiments of the present disclosure.

FIG. 9 is a top view of a first substrate 400A in accordance with some embodiments of the present disclosure, and FIG. 10 is a cross-sectional view along line C-C' of the first substrate 400A in FIG. 9, in accordance with some embodiments of the present disclosure.

As shown in FIG. 9, the first substrate 400A includes a data line 404, a high voltage circuit 406, a data line 408 and a low voltage circuit 402. The pixel region of the first substrate 400A is defined by the data line 404, the high voltage circuit 406, the data line 408 and the low voltage circuit 402. In addition, the first substrate 400A also includes a first electrode 414, a second electrode 412 disposed under the first electrode 414 and a light-emitting diode 410. The first electrode 414 and the second electrode 412 may be the electrodes of the capacitor shown in FIG. 8. The material of the first electrode 414 and the second electrode 412 may include, but is not limited to, copper, aluminum, tungsten, gold, chromium, nickel, platinum, titanium, iridium, rhodium, the above alloys, or indium tin oxide (ITO), tin oxide (TO), indium zinc oxide (IZO), indium gallium oxide (IGZO), indium tin zinc oxide (ITZO), antimony tin oxide (ATO), antimony zinc oxide (AZO), the above combination or any other applicable transparent conductive oxide material.

Referring to FIG. 10, it should be noted that the first electrode 414 is not located at line C-C, and therefore the first electrode 414 is not illustrated in FIG. 10. As shown in FIG. 10, the first substrate 400A includes a buffer layer 418, conductive pads 420/436, a metal layers 421, a transistor 422 and passivation layers 426/428/430/432. The first substrate 400A may be a carrier substrate which may include, but is not limited to, a glass substrate, a ceramic substrate, a plastic substrate or another applicable substrate. The buffer layer 418 is formed over the first substrate 400A, which may include, but is not limited to, silicon dioxide, silicon nitride, silicon oxynitride, and other applicable dielectric materials. The buffer layer 418 may be formed by chemical vapor deposition (CVD), spin-on coating or another applicable method.

The transistor 422 is formed in the passivation layer 426, and electrically connected to the light-emitting diode 410 through a conductive via 424, a metal layer 425, a conductive via 434 and the conductive pad 436. The transistor 422 is also electrically connected to other electronic elements (not shown) such as a demultiplexer, a gate driver circuit through the conductive via 424, the metal layer 425 and the metal layer 421.

In some embodiments, the first electrode 414 is formed over the transistor 422, and the second electrode 412 is formed between the first electrode 414 and the transistor 422. Moreover, as shown in FIG. 9, the first electrode 414 has a first projection on the first substrate 400A with a first area, and the second electrode 412 has a second projection on the first substrate 400A with a second area. In some embodiments, the first area is smaller than the second area. In addition, as shown in FIG. 9, the light-emitting diode 410 has a third projection on the first substrate 400A. The third projection does not overlap the first projection, and the third projection overlaps the second projection.

The materials of the conductive pads 420/436, the metal layers 421/425, and the conductive vias 424/434 may include, but is not limited to, copper, aluminum, tungsten, gold, chromium, nickel, platinum, titanium, iridium, rhodium, the above alloys, the above combination or any other applicable materials. The conductive pads 420/436, the metal layers 421/425, and the conductive vias 424/434 may be formed by a deposition process, a lithography process and an etching process. The deposition process includes, but is not limited to, chemical vapor deposition (CVD), sputtering, resistive thermal evaporation, electron beam evaporation, and any other applicable methods. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), and any other applicable methods. The lithography process includes, but is not limited to, photoresist coating (e.g., spin-on coating), soft baking, mask alignment, exposure, post-exposure baking, developing the photoresist, rinsing and drying (e.g., hard baking). The photolithography process may also be implemented or replaced by another proper method such as maskless photolithography, electron-beam writing or ion-beam writing. The etching process may include, but is not limited to, dry etching, wet etching, and other etching methods.

The material of the passivation layers 426/428/430/432 may include, but is not limited to, silicon oxide, silicon nitride, silicon oxynitride, high-k material, any other applicable dielectric material, and combinations thereof. The high-k material refers to a material with a high dielectric constant and it may include, but is not limited to, metal oxide, metal nitride, metal silicide, transition metal oxide, transition metal nitride, transition metal silicide, transition metal oxynitride, metal aluminate, zirconium silicate, and zirconium aluminate. For example, the material of the high-k material may include, but is not limited to, LaO, AlO, ZrO, TiO, Ta$_2$O$_5$, Y$_2$O$_3$, SrTiO$_3$(STO), BaTiO$_3$(BTO), BaZrO, HfO$_2$, HfO$_3$, HfZrO, HfLaO, HfSiO, HfSiON, LaSiO, AlSiO, HfTaO, HfTiO, HfTaTiO, HfAlON, (Ba,Sr)TiO$_3$(BST), Al$_2$O$_3$, any other applicable high-k dielectric material, and combinations thereof. In addition, the passivation layers 426/428/430/432 may also include, but is not limited to, phosphosilicate glass (PSG), borophosphosilicate glass (BPSG), low dielectric constant (low-k) dielectric material and other applicable dielectric materials. The low dielectric constant dielectric materials include, but are not limited to, fluorinated silica glass (FSG), carbon doped silicon oxide, amorphous fluorinated carbon, parylene, bisbenzocyclobutenes (BCB), polyimides, combinations of the above-mentioned materials, and other applicable materials.

As shown in FIG. 10, the light-emitting diode 410 is formed in a fifth filler 438. The light-emitting diode 410 includes a first electrode 444A, a second electrode 444B, a first semiconductor layer 446A, a second semiconductor layer 446B and a light-emitting layer 445. In addition, the light-emitting diode 410 is surrounded by a light shielding layer 440 to prevent the light, which is emitted by the light-emitting diode 410, from emitting from horizontal side. The material of the fifth filler 438 may be the same as or similar to that of the first filler 414. In addition, the first substrate 400A further includes an orientation layer 442. In some embodiments, the orientation layer 442 is formed over the light-emitting diode 410. The material of the orientation layer 442 may include, but is not limited to, polyimide (PI).

Figure 11:
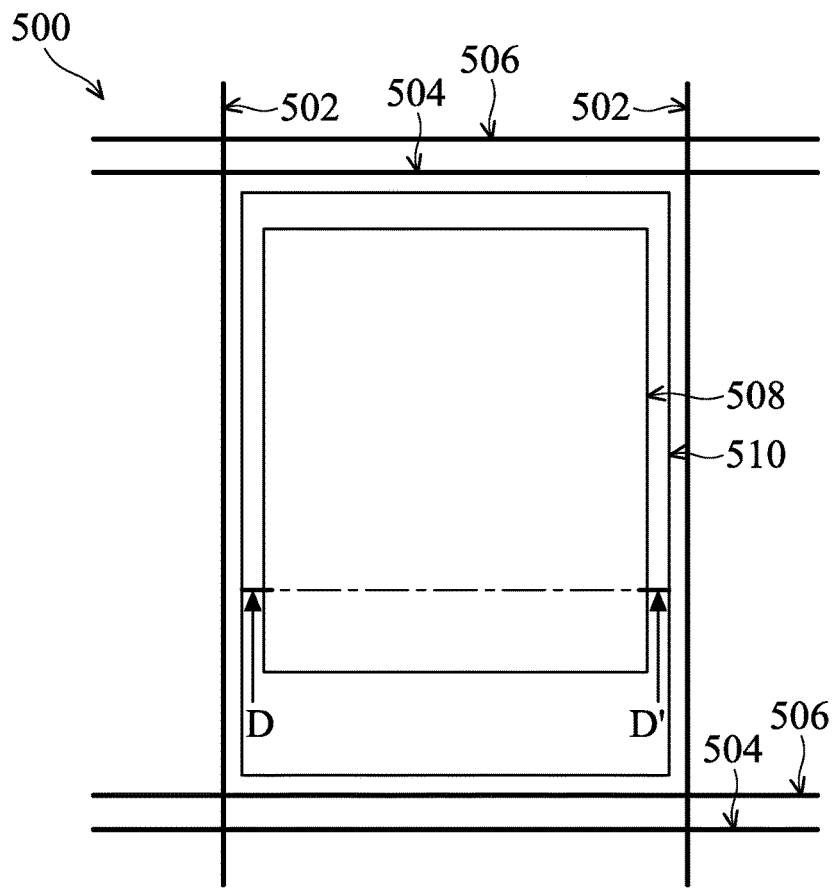
FIG. 11 is a top view of a second substrate in accordance with some embodiments of the present disclosure.
Figure 12:
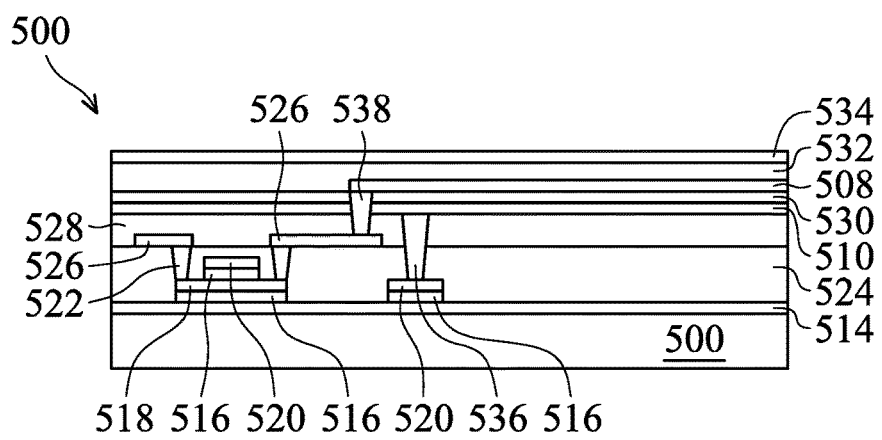
FIG. 12 is a cross-sectional view along line D-D' of the second substrate in FIG. 11 in accordance with some embodiments of the present disclosure.

FIG. 11 is a top view of a second substrate 500 in accordance with some embodiments of the present disclosure, and FIG. 12 is a cross-sectional view along line D-D' of the second substrate 500 in FIG. 11, in accordance with some embodiments of the present disclosure.

As shown in FIG. 11, the second substrate 500 includes a data line 502 extending along the second direction. The second substrate 500 also includes a scan line 504 and a common electrode circuit 506 extending along the first direction which is perpendicular to the second direction. In addition, the second substrate 500 also includes a first electrode 508 and a second electrode 510 formed under the first electrode 508. The material of the first electrode 508 and the second electrode 510 may be the same as or similar to that of the second electrode 412.

As shown in FIG. 12, the second substrate 500 includes a buffer layer 514, a conductive pad 516, conductive vias 522/538, a metal layer 526, a transistor 518 and passivation layers 524/528/530/532. The second substrate 500 may be a carrier substrate, which includes, but is not limited to, a glass substrate, a ceramic substrate, a plastic substrate or another applicable transparent substrate.

In some embodiments, the transistor 518 is electrically connected to the conductive via 522, the metal layer 526, the conductive via 538 and the first electrode 508. The second electrode 510 is formed between the first electrode 508 and the transistor 518. In some embodiments, as shown in FIGS. 11-12, the first electrode 508 has a fifth projection on the second substrate 500 with a fourth area, and the second electrode 510 has a sixth projection on the second substrate 500 with a fifth area. The fourth area is smaller than the fifth area.

In addition, the second substrate 500 further includes an orientation layer 534. The first electrode 508 is formed between the orientation layer 534 and the second electrode 510.

Figure 13:
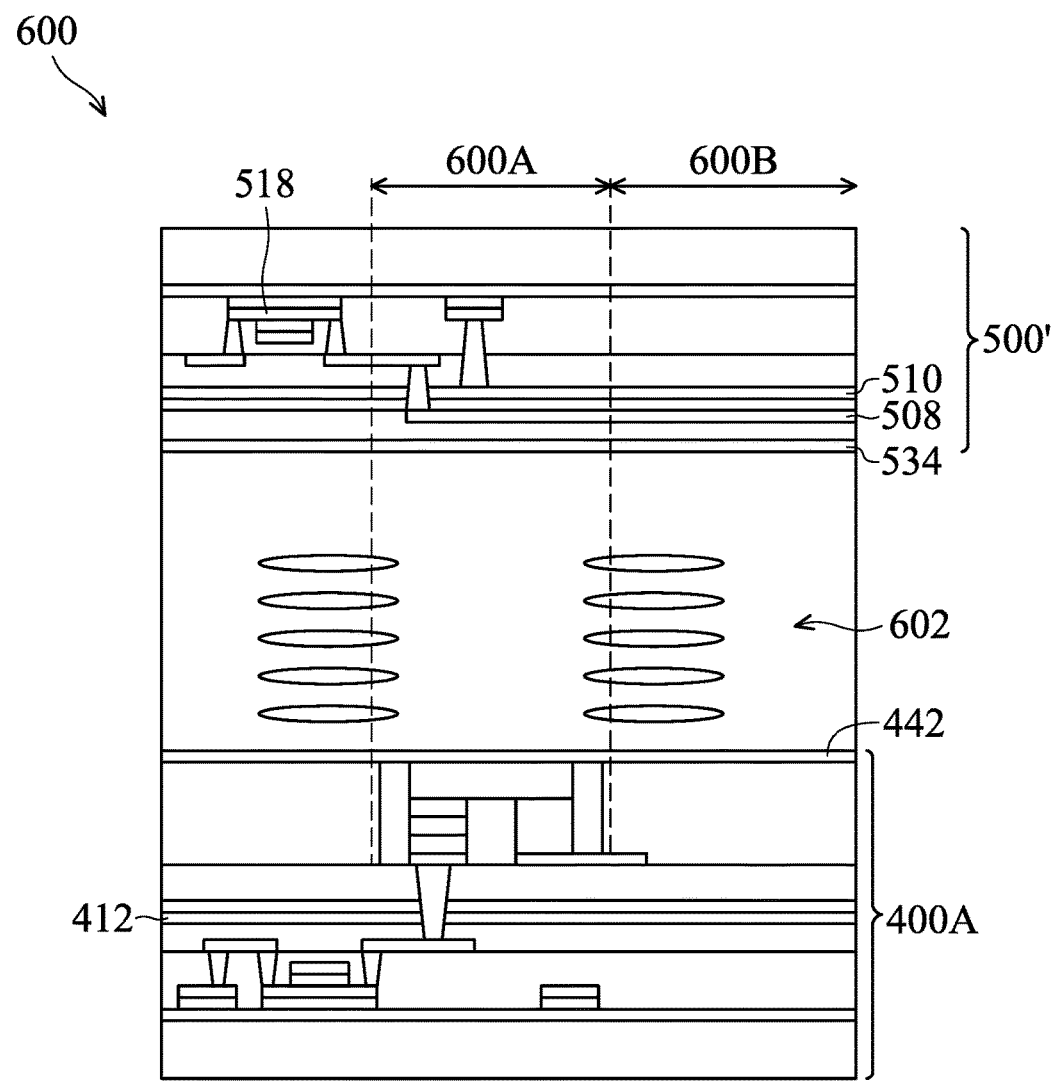
FIG. 13 is a cross-sectional view of a display device in accordance with some embodiments of the present disclosure.

FIG. 13 is a cross-sectional view of a display device 600 in accordance with some embodiments of the present disclosure. In some embodiments, as shown in FIG. 13, the display device 600 includes the first substrate 400A, a liquid-crystal layer 602 and a second substrate 500'. The second substrate 500' is a pattern which is formed by flipping over the second substrate 500. In this embodiment, the liquid-crystal layer 602 is formed between the orientation layer 534 and the orientation layer 442, and the first electrode 508 of the second substrate 500' is formed over the orientation layer 534. Moreover, the second electrode 510 of the second substrate 500' is formed over the first electrode 508 of the second substrate 500', and the transistor 518 is formed over the second electrode 510 of the second substrate 500'.

In some embodiments, referring to FIG. 13, the liquid-crystal layer 602 may be, but is not limited to, a nematic liquid crystal, a smectic liquid crystal, a cholesteric liquid crystal, a blue phase liquid crystal, or any other applicable liquid-crystal material. In this embodiment, the second electrode 412 of the first substrate 400A and the first electrode 508 of the second substrate 500' are used as common electrodes for controlling the orientation of the liquid-crystal layer 602, and thereby an electric field is generated between the first substrate 400A and the second substrate 500'. As a result, the orientation of the liquid-crystal molecules in the liquid-crystal layer 602 can be controlled.

In some embodiments, as shown in FIG. 13, the display device 600 includes a light-emitting region 600A and a transparent region 600B. The light-emitting region of the first substrate 400A overlaps the light-emitting region of the second substrate 500', and the transparent region of the first substrate 400A overlaps the transparent region of the second substrate 500'.

Figure 14:
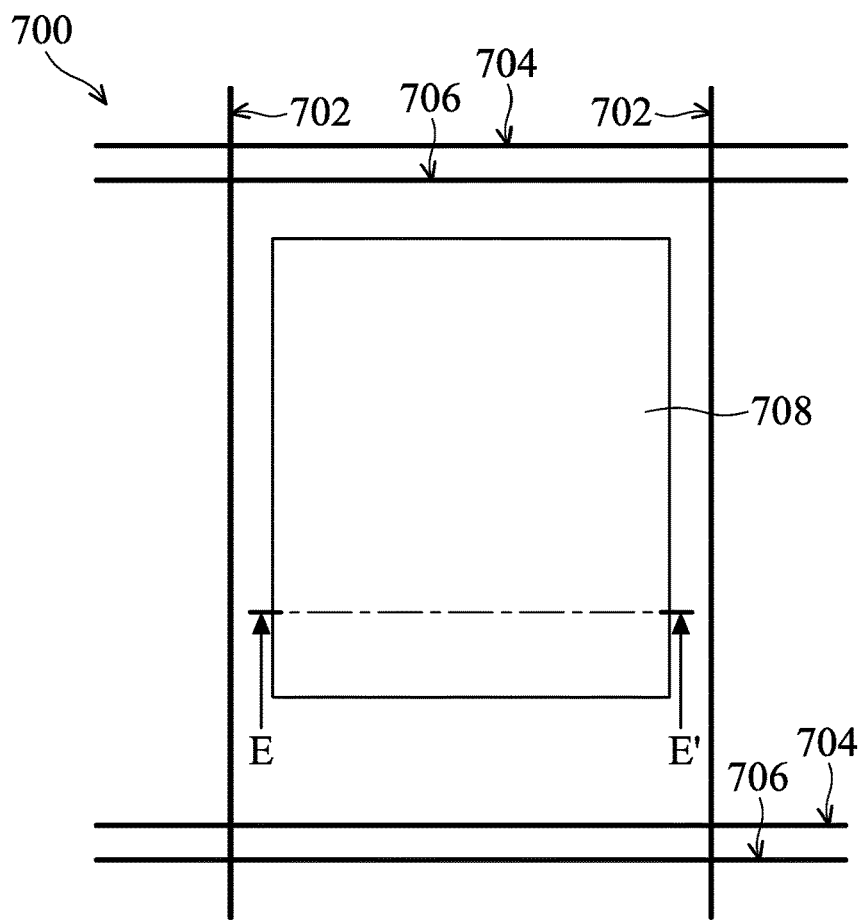
FIG. 14 is a top view of a second substrate in accordance with some embodiments of the present disclosure.
Figure 15:
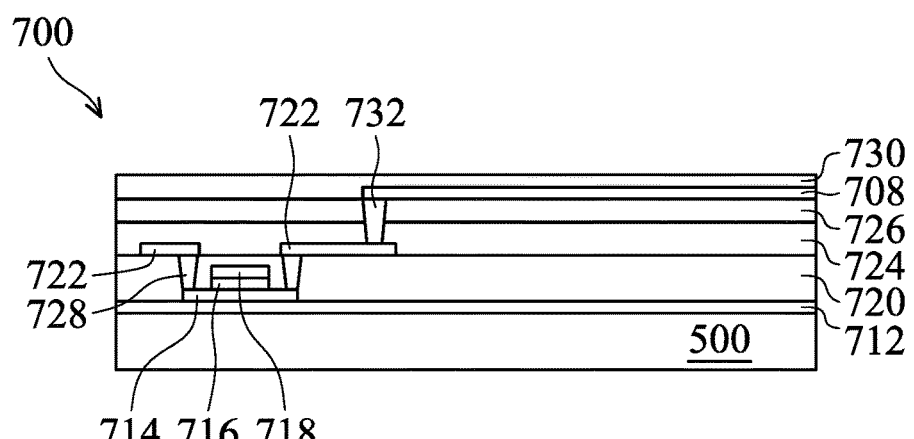
FIG. 15 is a cross-sectional view along line E-E' of the second substrate in FIG. 14 in accordance with some embodiments of the present disclosure.

FIG. 14 is a top view of a second substrate 700 in accordance with some embodiments of the present disclosure, and FIG. 15 is a cross-sectional view along line E-E' of the second substrate 700 in FIG. 14 in accordance with some embodiments of the present disclosure.

As shown in FIG. 14, the second substrate 700 includes a data line 702 extending along the second direction. The second substrate 700 also includes a scan line 706 and a common electrode circuit 704 extending along the first direction which is perpendicular to the second direction. In addition, the second substrate 700 also includes a first electrode 708. The material of the first electrode 708 may be the same as or similar to that of the first electrode 414 of the first substrate 400A.

As shown in FIG. 15, the second substrate 700 includes a buffer layer 712, a conductive pad 716, conductive vias 728/732, a metal layer 718, a transistor 714 and passivation layers 720/724/726. The second substrate 700 may be a carrier substrate, which includes, but is not limited to, a glass substrate, a ceramic substrate, a plastic substrate or another applicable transparent substrate.

In some embodiments, the transistor 714 is electrically connected to the first electrode 708 through the conductive via 728, the metal layer 722 and the conductive via 732. The first electrode 708 is formed over the transistor 714.

In addition, the second substrate 700 further includes an orientation layer 730 which is formed over the transistor 714.

Figure 16:
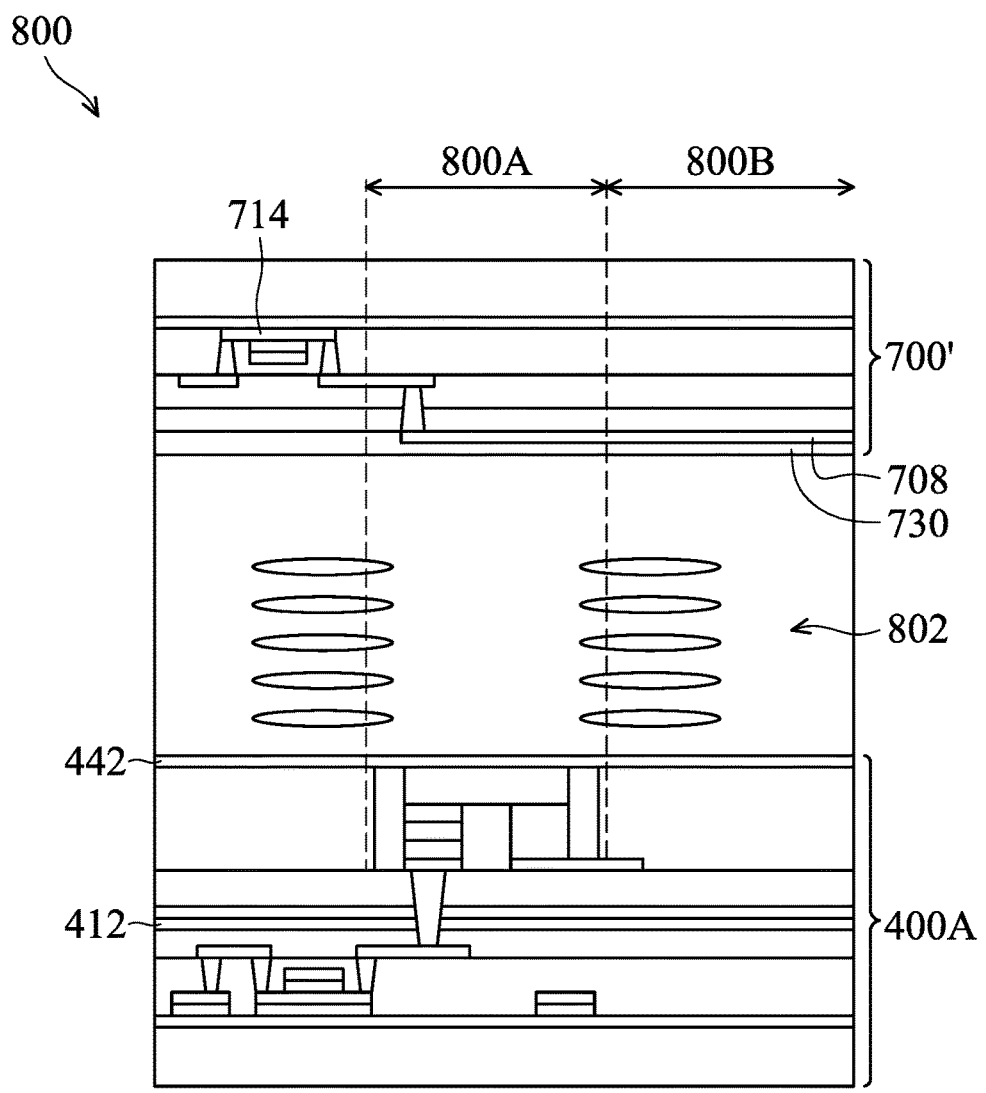
FIG. 16 is a cross-sectional view of a display device in accordance with some embodiments of the present disclosure.

FIG. 16 is a cross-sectional view of a display device 800 in accordance with some embodiments of the present disclosure. In some embodiments, as shown in FIG. 16, the display device 800 includes the first substrate 400A, a liquid-crystal layer 802 and a second substrate 700'. The second substrate 700' is a pattern which is formed by flipping over the second substrate 700. In this embodiment, the liquid-crystal layer 802 is formed between the orientation layer 730 and the orientation layer 442, and the first electrode 708 is disposed between the transistor 714 and the liquid-crystal layer 802. In this embodiment, the second electrode 412 of the first substrate 400A and the first electrode 708 of the second substrate 700' are used as common electrodes for controlling the orientation of the liquid-crystal layer 802, and thereby an electric field is generated between the first substrate 400A and the second substrate 700'. As a result, the orientation of the liquid-crystal molecules in the liquid-crystal layer 802 can be controlled. In some embodiments, as shown in FIG. 16, the display device 800 includes a light-emitting region 800A and a transparent region 800B. The light-emitting region of the first substrate 400A overlaps the light-emitting region of the second substrate 700', and the transparent region of the first substrate 400A overlaps the transparent region of the second substrate 700'.

Figure 17:
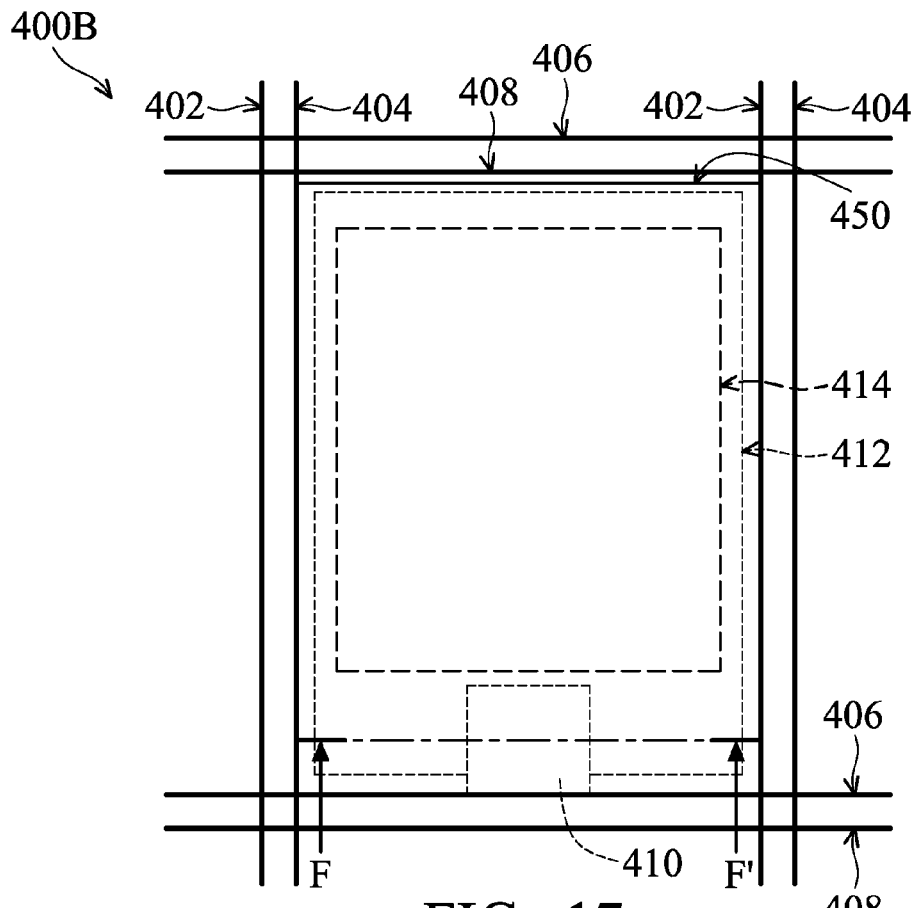
FIG. 17 is a top view of a first substrate in accordance with some embodiments of the present disclosure.
Figure 18:
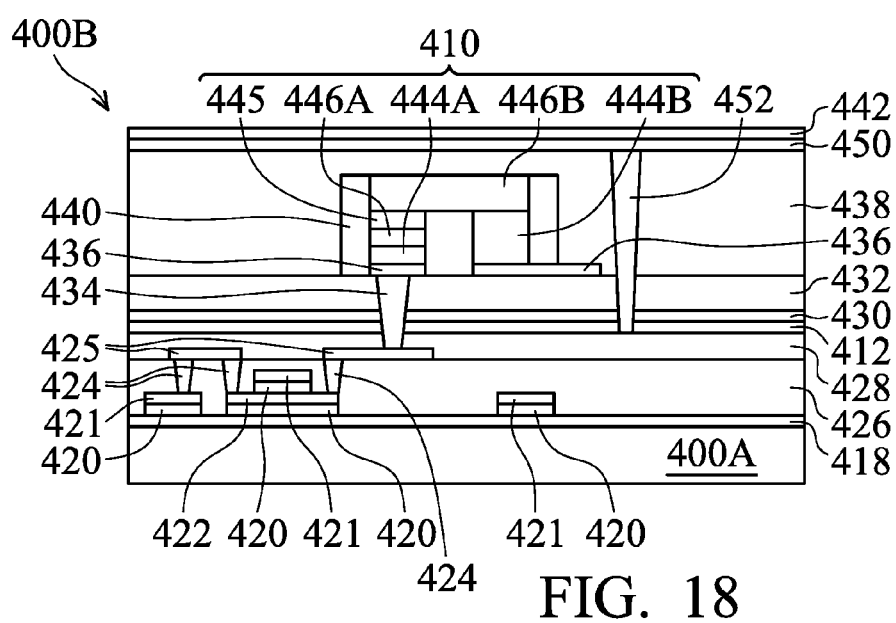
FIG. 18 is a cross-sectional view along line F-F' of the first substrate in FIG. 17 in accordance with some embodiments of the present disclosure.

FIG. 17 is a top view of a first substrate 400B in accordance with some embodiments of the present disclosure, and FIG. 18 is a cross-sectional view along line F-F' of the first substrate 400B in FIG. 17 in accordance with some embodiments of the present disclosure.

As shown in FIG. 17, the first substrate 400B includes the data line 404, the high voltage circuit 406, the data line 408 and the low voltage circuit 402. In addition, the first substrate 400B also includes the first electrode 414, the second electrode 412 and the light-emitting diode 410. In some embodiments, the first substrate 400B further includes a third electrode 450 formed over the first electrode layer 414 and the second electrode layer 412. The material of the third electrode 450 may be the same as or similar to that of the first electrode 414.

Referring to FIG. 18, it should be noted that the first electrode 414 is not located at line F-F', and therefore the first electrode 414 is not illustrated in FIG. 17. Moreover, descriptions of elements of the embodiments hereinafter that are the same or similar as those previously described with reference to FIG. 10 are omitted for brevity. As shown in FIG. 18, the third electrode 450 is formed over the light-emitting diode 410, and between the orientation layer 442 and the second electrode 412. In addition, the third electrode 450 is electrically connected to the second electrode 412 through the conductive via 452.

In some embodiments, as shown in FIGS. 17-18, the first electrode 414 has a first projection on the first substrate 400A with a first area, the second electrode 412 has a second projection on the first substrate 400A with a second area, the light-emitting diode has a third projection on the first substrate 400A, and the third electrode 450 has a fourth projection on the first substrate 400A with a third area. In some embodiments, the third area may be the same as the second area, and the third area is greater than the first area. In addition, as shown in FIG. 17, the third projection does not overlap the first projection, and the third projection overlaps the second projection and the fourth projection.

In some embodiments, the first substrate 400A of the display device 600 shown in FIG. 13 and the display device 800 shown in FIG. 16 can be replaced by the first substrate 400B. In this embodiment, the third electrode 450 may be used as a common electrode for controlling the orientation of the liquid-crystal layer 602 and the liquid-crystal layer 802. Since the distances between the third electrode 450 of the first substrate 400B and the first electrode 508 of the second substrate 600, or the distance between the third electrode 450 of the first substrate 400B and the first electrode 708 of the second substrate 800, are shorter, the orientation of the liquid-crystal layer 602 and the liquid-crystal layer 802 can be controlled easily.

Figure 19:
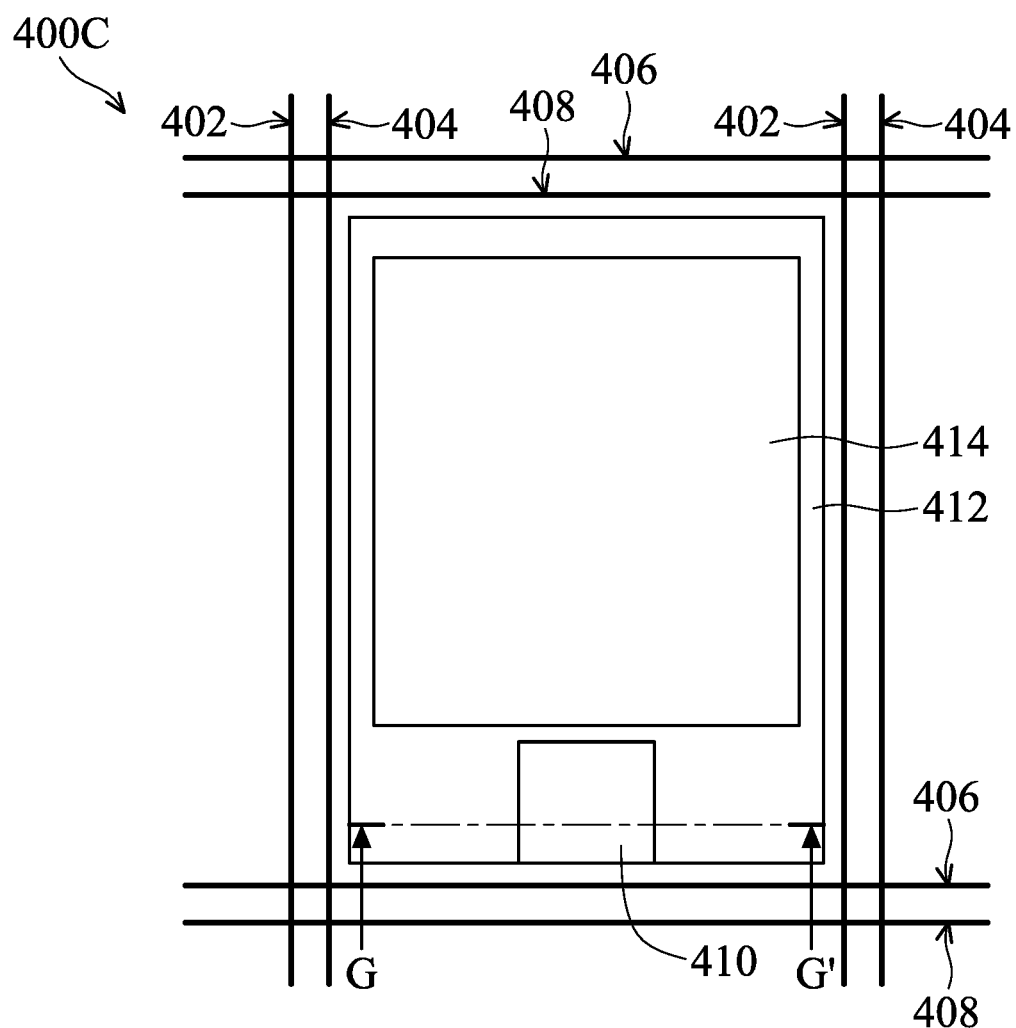
FIG. 19 is a top view of a first substrate in accordance with some embodiments of the present disclosure.
Figure 20:
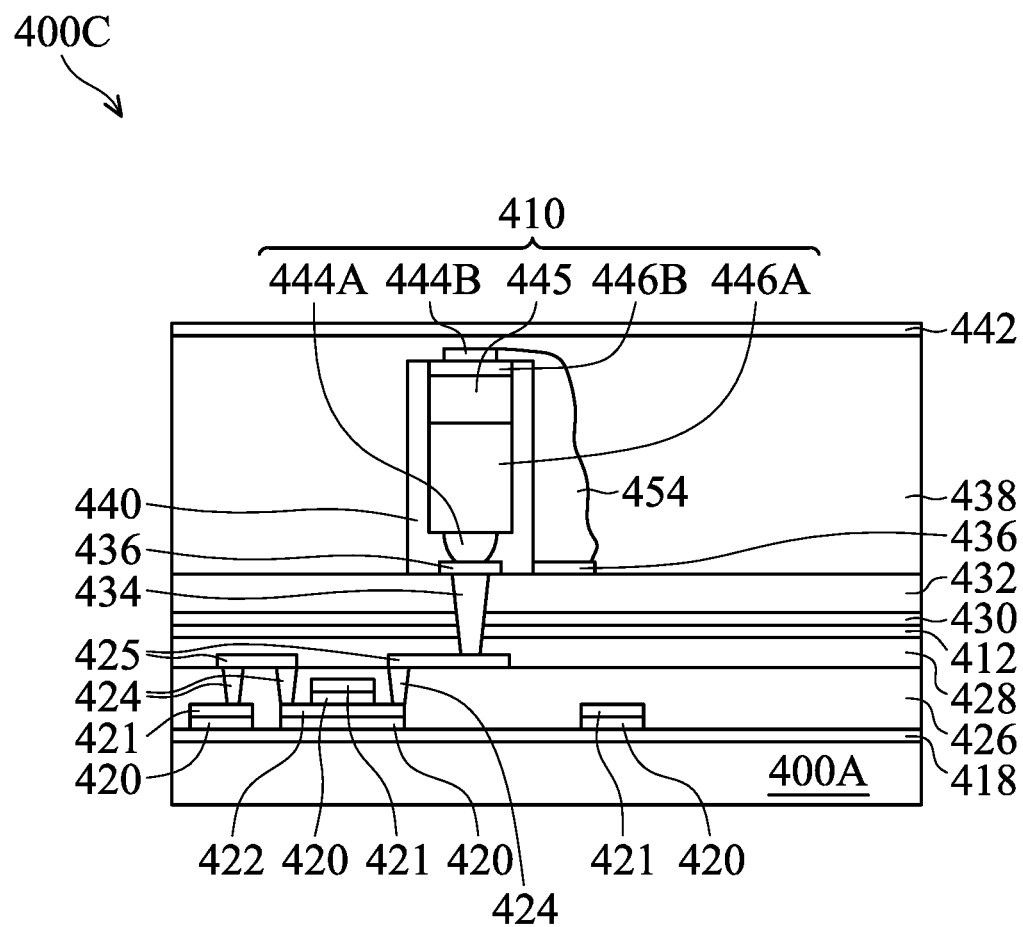
FIG. 20 is a cross-sectional view along line G-G' of the first substrate in FIG. 19 in accordance with some embodiments of the present disclosure.

FIG. 19 is a top view of a first substrate 400C in accordance with some embodiments of the present disclosure, and FIG. 20 is a cross-sectional view along line G-G' of the first substrate 400C in FIG. 19 in accordance with some embodiments of the present disclosure.

As shown in FIG. 19, the first substrate 400C includes the data line 404, the high voltage circuit 406, the data line 408 and the low voltage circuit 402. In addition, the first substrate 400C also includes the first electrode 414, the second electrode 412 and the light-emitting diode 410.

Referring to FIG. 20, it should be noted that the first electrode 414 is not located at line G-G', and therefore the first electrode 414 is not illustrated in FIG. 19. Moreover, descriptions of elements of the embodiments hereinafter that are the same or similar as those previously described with reference to FIG. 10 are omitted for brevity. In some embodiments, as shown in FIG. 20, the first semiconductor layer 446A, the second semiconductor layer 446B, and the light-emitting layer 445 are formed between the first electrode 444A and the second electrode 444B. In this embodiment, the transistor 422 is electrically connected to the first electrode 444A, and the second electrode 444B is electrically connected to the metal layer 436 by a conductive gel 454. The material of the conductive gel 454 may include, but is not limited to, gold, silver, copper or another applicable conductive material. In addition, the distance between the top surface of the first electrode 444A of the light-emitting diode 410 and the top surface of the second semiconductor layer 446B is between 2 μm and 12 μm. In some embodiments, the distance is in a range of 3 μm to 5 μm.

In some embodiments, the first substrate 400A of the display device 600 shown in FIG. 13 and the display device 800 shown in FIG. 16 can be replaced by the first substrate 400C.

Figure 21:
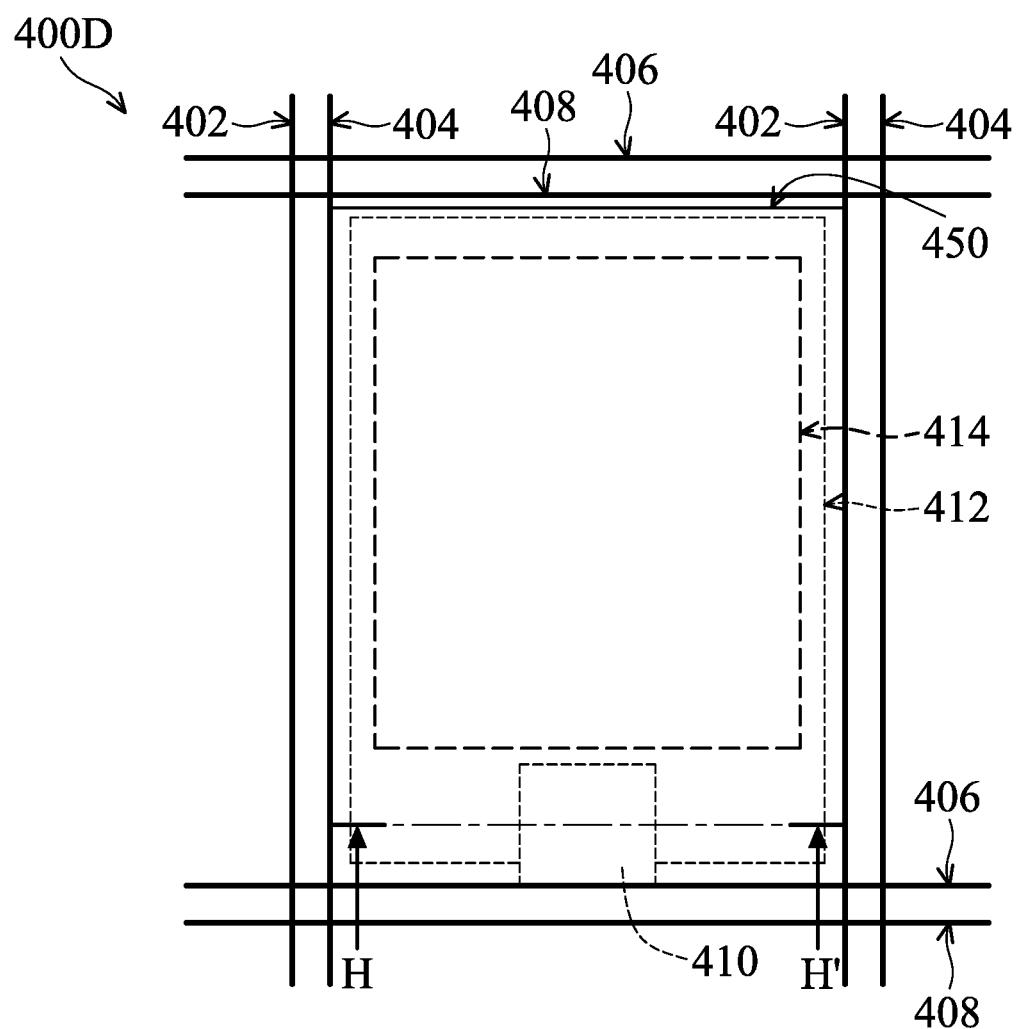
FIG. 21 is a top view of a first substrate in accordance with some embodiments of the present disclosure.
Figure 22:
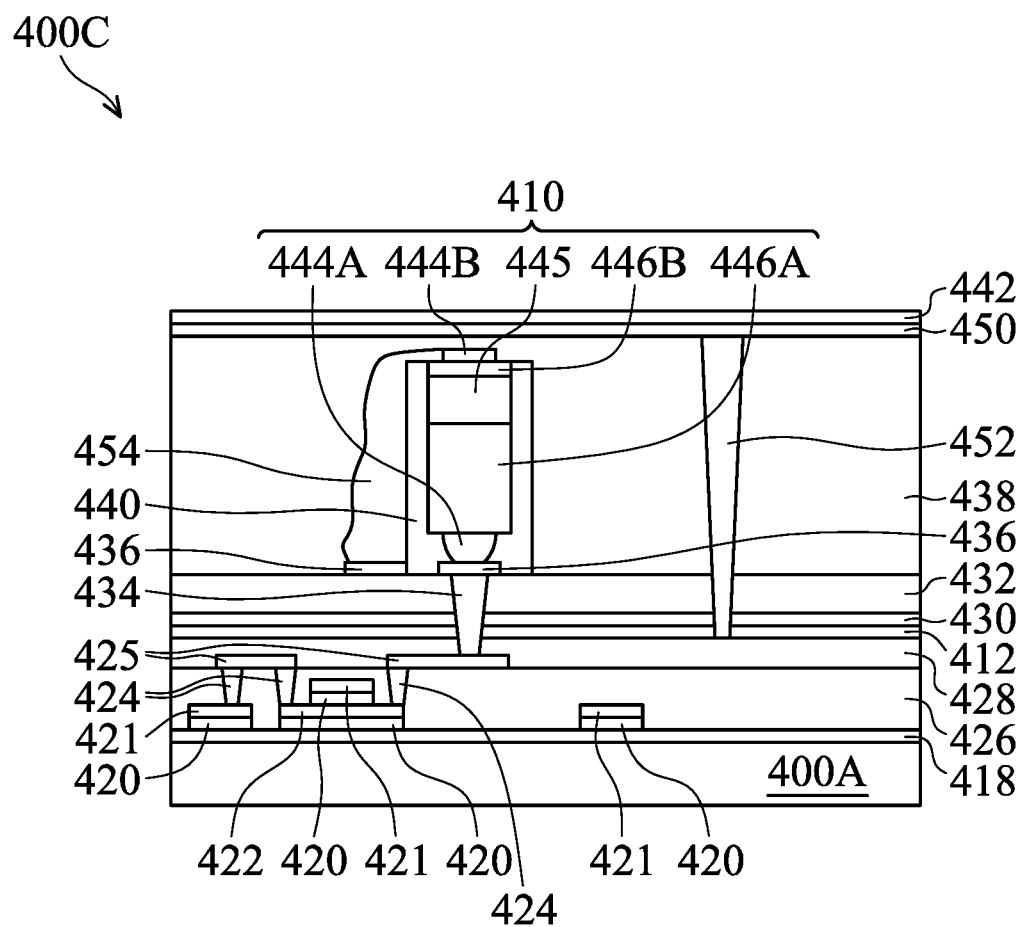
FIG. 22 is a cross-sectional view along line H-H' of the first substrate in FIG. 21 in accordance with some embodiments of the present disclosure.

FIG. 21 is a top view of a first substrate 400D in accordance with some embodiments of the present disclosure, and FIG. 22 is a cross-sectional view along line H-H' of the first substrate 400D in FIG. 21 in accordance with some embodiments of the present disclosure.

As shown in FIG. 21, the first substrate 400D includes the data line 404, the high voltage circuit 406, the data line 408 and the low voltage circuit 402. In addition, the first substrate 400D also includes the first electrode 414, the second electrode 412, the light-emitting diode 410 and the third electrode 450.

Referring to FIG. 22, it should be noted that the first electrode 414 is not located at line H-H', and therefore the first electrode 414 is not illustrated in FIG. 21. Moreover, descriptions of elements of the embodiments hereinafter that are the same or similar as those previously described with reference to FIG. 10 are omitted for brevity. In some embodiments, as shown in FIG. 22, the first semiconductor layer 446A, the second semiconductor layer 446B, and the light-emitting layer 445 are formed between the first electrode 444A and the second electrode 444B. In this embodiment, the transistor 422 is electrically connected to the first electrode 444A, and the second electrode 444B is electrically connected to the metal layer 436 by a conductive gel 454. In addition, the third electrode 450 is formed over the light-emitting diode 410, and between the orientation layer 442 and the second electrode 412. Moreover, the third electrode 450 is electrically connected to the second electrode 412 by a conductive via 452.

In some embodiments, the first substrate 400A of the display device 600 shown in FIG. 13 and the display device 800 shown in FIG. 16 can be replaced by the first substrate 400D.

Figure 23:
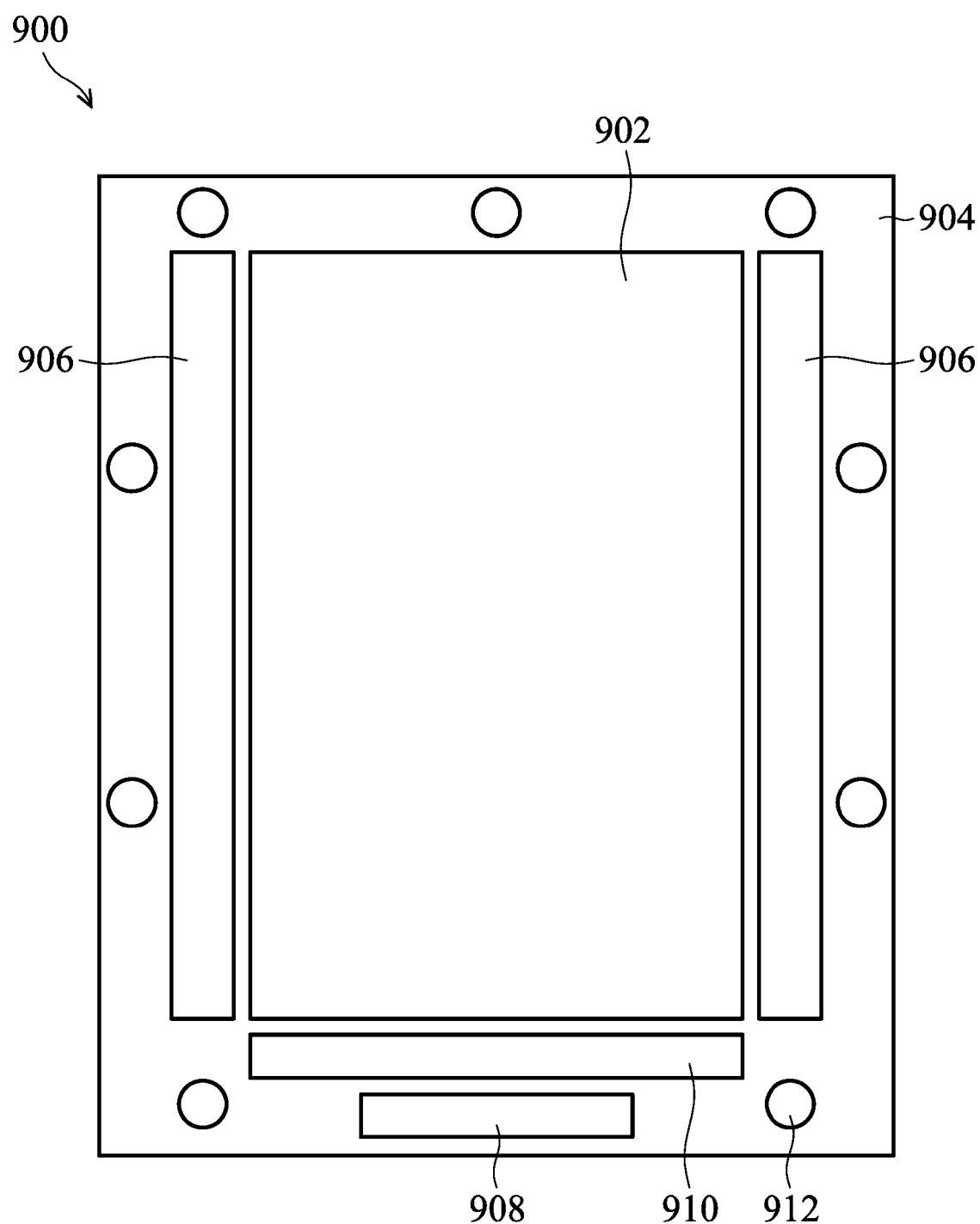
FIG. 23 is a top view of a display device in accordance with some embodiments of the present disclosure.

FIG. 23 is a top view of a display device 900 in accordance with some embodiments of the present disclosure. As shown in FIG. 23, the display device 900 includes an active region 902 and a peripheral region 904. A gate driver circuit 906, a connective region 908, a demultiplexer 910 and conductive materials 912 are formed in the peripheral region 904. In some embodiments, the conductive materials are formed in the peripheral of the display device 900, and the active region 902 is surrounded by the conductive materials 912. The conductive materials 912 is connected to the first substrate (e.g., the first substrate 400A/400B/400C/400D) and the second substrate (e.g., the second substrate 500/700). In addition, the conductive materials 912 are also electrically connected to the gate driver circuit 906, the connective region 908 and the demultiplexer 910. The conductive materials 912 may include, but is not limited to, gold, silver, copper or other applicable materials.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A display device, comprising:
   a first substrate having a light-emitting region and a first transparent region,
   wherein the first substrate comprises:
      a plurality of transistors; and
      at least one light-emitting diode disposed in the light-emitting region,
      wherein the light-emitting diode comprises:
         a first electrode electrically connected to the corresponding transistor;
         a first semiconductor layer disposed over the first electrode of the light-emitting diode;
         a second semiconductor layer disposed over the first semiconductor layer; and
         a light-emitting layer disposed between the first semiconductor layer and the second semiconductor layer,
      wherein a distance between a top surface of the first electrode of the light-emitting diode and a top surface of the second semiconductor layer is in a range between 2 μm and 12 μm.

2. The display device as claimed in claim 1, wherein the light-emitting region is adjacent to the first transparent region, and the light-emitting region comprises:
   a first light-emitting region corresponding to a blue pixel;
   a second light-emitting region corresponding to a green pixel; and
   a third light-emitting region corresponding to a red pixel.

3. The display device as claimed in claim 2, further comprising:
   a first filler disposed in the light-emitting region, and over the first substrate;
   a second filler disposed in the light-emitting region, and over the first filler; and
   a third filler disposed in the transparent region,
   wherein transmittance of the third filler is different than transmittance of the first filler, and the transmittance of the first filler is different than transmittance of the second filler.

4. The display device as claimed in claim 2, wherein the light-emitting diode comprises:
   a first light-emitting diode disposed in the first light-emitting region and emitting blue light;
   a second light-emitting diode disposed in the second light-emitting region emitting green light; and
   a third light-emitting diode disposed in the third light-emitting region emitting red light.

5. The display device as claimed in claim 2, further comprising:
   a quantum dot film disposed over the light-emitting diode; and
   a light filter disposed over the quantum dot film.

6. The display device as claimed in claim 5, wherein the light-emitting diode comprises:
   a first light-emitting diode disposed in the first light-emitting region;
   a second light-emitting diode disposed in the second light-emitting region; and
   a third light-emitting diode disposed in the third light-emitting region,
   wherein the first light-emitting diode, the second light-emitting diode and the third light-emitting diode emit blue light.

7. The display device as claimed in claim 1, further comprising:
   a first optical layer disposed between the first substrate and the light-emitting diode; and
   a second optical layer disposed over the light-emitting diode.

8. The display device as claimed in claim 7, wherein the light-emitting region comprises:
   a first light-emitting region corresponding to a blue pixel;
   a second light-emitting region corresponding to a green pixel; and
   a third light-emitting region corresponding to a red pixel.

9. The display device as claimed in claim 8, wherein the first light-emitting diode has a first length along a first direction, the second light-emitting diode has a second length along the first direction, and the third light-emitting diode has a third length along the first direction, wherein the first length is greater than the second length, and the second length is greater the third length.

10. The display device as claimed in claim 1, further comprising:
    a second substrate disposed opposite to the first substrate; and
    a liquid-crystal layer disposed between the first substrate and the second substrate.

11. The display device as claimed in claim 10, wherein the first substrate further comprises:
  at least a first transistor electrically connected to the corresponding light-emitting diode; and
  a capacitor disposed over the first transistor, wherein the capacitor comprises:
  a first electrode disposed on the first transistor;
  a second electrode disposed between the first electrode of the capacitor and the first transistor; and
  a dielectric layer disposed between the first electrode and the second electrode of the capacitor.

12. The display device as claimed in claim 11, wherein the first electrode of the capacitor has a first projection on the first substrate with a first area, and the second electrode of the capacitor has a second projection on the first substrate with a second area, wherein the first area is smaller than the second area.

13. The display device as claimed in claim 10, wherein the second substrate comprises:
  a plurality of second transistors;
  an orientation layer disposed between the liquid-crystal layer and the plurality of second transistors, and adjacent to the liquid-crystal layer; and
  a first electrode disposed between the orientation layer and the plurality of second transistors, and electrically connected to the plurality of second transistors.

14. The display device as claimed in claim 13, wherein the second substrate further comprises:
  a second electrode disposed between the plurality of second transistors and the first electrode of the second substrate.

15. The display device as claimed in claim 7, wherein the light-emitting region overlaps the first transparent region.

16. The display device as claimed in claim 7, wherein the light-emitting region is located on two opposite sides of the light-emitting diode.

17. The display device as claimed in claim 10, wherein the second substrate has a second transparent region, and the first transparent region overlaps the second transparent region.

18. The display device as claimed in claim 11, wherein the first substrate comprises a third electrode disposed over the light-emitting diode.

19. The display device as claimed in claim 11, wherein the first electrode of the capacitor has a first projection on the first substrate with a first area and the third electrode has a third projection on the first substrate with a third area, and the first area is smaller than the third area.

20. The display device as claimed in claim 18, wherein the first substrate comprises a conductive via disposed over the second electrode of the capacitor, and the second electrode of the capacitor is electrically connected to the third electrode through the conductive via.

* * * * *